(12) United States Patent
Nakatake et al.

(10) Patent No.: US 6,337,827 B1
(45) Date of Patent: Jan. 8, 2002

(54) VOLTAGE-DROPPING POWER UNIT FOR SEMICONDUCTOR MEMORY DEVICE

(75) Inventors: Yoshihiro Nakatake; Tetsuya Mitoma, both of Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/754,265

(22) Filed: Jan. 5, 2001

(51) Int. Cl.[7] .................................................. G11C 7/00
(52) U.S. Cl. ................................... 365/226; 365/189.11
(58) Field of Search .......................... 365/226, 189.11, 365/189.07, 189.09

(56) References Cited

U.S. PATENT DOCUMENTS

| | | | | |
|---|---|---|---|---|
| 5,249,155 A | * | 9/1993 | Arimoto et al. | 365/226 |
| 5,327,388 A | * | 7/1994 | Kobayashi | 365/226 |
| 5,612,920 A | * | 3/1997 | Tomishima | 365/226 |
| 5,805,519 A | * | 9/1998 | Tomishima | 365/189.11 |
| 6,072,742 A | * | 7/2000 | Ooishi | 365/226 |

FOREIGN PATENT DOCUMENTS

| | | |
|---|---|---|
| JP | 9-35484 | 2/1997 |
| JP | 10-312683 | 11/1998 |
| JP | 11-120783 | 4/1999 |

* cited by examiner

*Primary Examiner*—Tan T. Nguyen
(74) *Attorney, Agent, or Firm*—Volentine Francos, PLLC

(57) ABSTRACT

A voltage dropping power unit is provided which is capable of reducing power consumption in the voltage dropping power unit while a semiconductor memory device is placed in a quiescent state. The voltage dropping power unit is provided with a voltage control circuit to supply a dropped voltage controlled depending on a control voltage to the semiconductor memory device, a reference circuit to generate a reference voltage used to produce a control voltage and a differential circuit to make the dropped voltage equal to the reference voltage irrespective of a level of a voltage output from the voltage control circuit. The reference circuit has a voltage dividing resistor used to produce a reference voltage and a switching device used to form a short-circuit across the voltage dividing resistor.

19 Claims, 6 Drawing Sheets

VOLTAGE-DROPPING POWER UNIT FOR SEMICONDUCTOR MEMORY DEVICE

BACKGROUND OF THE INVENTION

1. Field of the Invention

The present invention relates to a voltage dropping power unit adapted to drop an internal supply voltage of semiconductor memory device-mounted information processing equipment such as a personal computer and to supply a predetermined operating voltage obtained by dropping the internal supply voltage to a semiconductor memory device such as a RAM (Random Access Memory) or a like mounted on the information processing equipment and more particularly to the voltage dropping power unit capable of reducing power consumption in the voltage dropping power unit itself while the semiconductor memory device is placed in a quiescent state.

2. Description of the Related Art

Generally, in a section on which a semiconductor memory device is packaged is embedded a voltage dropping power unit used to supply an operating voltage obtained by dropping an internal supply voltage of semiconductor memory device-based information processing equipment to a semiconductor memory device. That is, the internal supply voltage is dropped by the voltage dropping power unit and a dropped voltage is applied as the operating voltage to the semiconductor memory device including a memory array or a like.

As shown in FIG. 6, a conventional voltage-dropping power unit 1 is provided with a voltage control circuit 2 having an active element 5 adapted to generate, using a supply voltage Vcc, a dropped voltage Vdd obtained by being controlled depending on a control voltage, a reference circuit 3 composed of an active element for calibrating currents 6 and voltage-dividing resistors 7a and 7b making up a group of voltage-dividing resistors and adapted to produce a predetermined reference voltage to be set by the active element 6 and a differential circuit 4 adapted to receive the reference voltage from the reference circuit 3 as an input voltage and an output voltage from the voltage control circuit 2 as an input voltage and to feed the control voltage to the voltage control circuit 2 so that both the input voltages are made equal. The reference circuit 3 outputs a voltage which has dropped at a node A when currents have flowed through the group of the voltage-dividing resistors, as the reference voltage, to the differential circuit 4. The differential circuit 4 is a so-called current mirror amplifying circuit which is provided with a current path composed of an active element 8a to receive a supply voltage Vcc and of an active element 9a connected in serial to the active element 8a to receive the dropped voltage Vdd being fed back from the voltage control circuit 2 and with a current path composed of an active element 8b to connect to a terminal of a supply voltage Vcc and of an active element 9b connected in serial to the active element 8b to receive the reference voltage and adapted to take out the control voltage based on a potential at a node B connected between the active element 8b and the active element 9b. Currents flowing through both the current paths can be adjusted by an active element for adjusting sensitivity 10. A voltage taken out from a node C between the active element 9a and the active element 8a is fed to the active element 9a and to the active element 9b to be used as the control voltage.

The differential circuit 4 performs a differential operation so that currents flowing through both the current paths are made equal and therefore the output voltage from the voltage control circuit 2 is made equal to the reference voltage, thus enabling the output voltage from the voltage control circuit 2, that is, the dropped voltage Vdd to be held at a constant value.

However, while the semiconductor memory device is placed in a quiescent state, the conventional voltage-dropping power unit continues to operate even when the semiconductor memory device is placed in operation. That is, in FIG. 6, in the reference circuit 3, constant currents flow, irrespective of whether the semiconductor memory device is in operation or in quiescent operation, through the active element for calibrating current 6 and the group of the voltage dividing resistors and the reference circuit 3 continues to output the predetermined reference voltage to the differential circuit 4. Moreover, in the differential circuit 4 which receives the reference voltage, currents continue to flow through the current path composed of the active elements 8a and 9a and through the current path composed of the active elements 8b and 9b and then through the active element 10 for adjusting sensitivity. As a result, even when the semiconductor memory device is in a quiescent state, power is consumed in the voltage dropping power unit in the same manner as in the case of in the semiconductor memory device being in operation.

SUMMARY OF THE INVENTION

In view of the above, it is an object of the present invention to provide a voltage dropping power unit being capable of reducing power consumption in the voltage dropping power unit while a semiconductor memory device is placed in a quiescent state.

According to a first aspect of the present invention, there is provided a voltage dropping power unit for dropping a supply voltage and for applying a dropped voltage to a semiconductor memory device, including:

a voltage control circuit to produce a voltage to be controlled depending on a control voltage in order to supply an operating voltage to the semiconductor memory device;

a reference voltage generating circuit to generate a reference voltage used to produce the control voltage;

a voltage differential circuit to perform a differential operation so that the voltage output from the voltage control circuit is made equal to the reference voltage irrespective of a level of said voltage output from the voltage control circuit; and wherein the reference voltage generating circuit is provided with a voltage dividing resistor to generate the reference voltage by receiving a current from a supply voltage source and a switching device to form a short-circuit across the voltage dividing resistor in order to decrease an operating current flowing through the voltage differential circuit while the semiconductor memory device is placed in a quiescent state.

In the foregoing, a preferable mode is one wherein the switching device in the reference voltage generating circuit is provided with a transistor device operated to form the short-circuit when the semiconductor memory device is in quiescent operation.

Also, a preferable mode is one wherein the reference voltage generating circuit includes an active device connected in serial to the voltage dividing resistor to adjust an amount of a current flowing through the voltage dividing resistor for making the reference voltage adjustable.

Also, a preferable mode is one wherein the transistor device is an n-type MOS (Metal Oxide Semiconductor)

transistor used to receive a signal informing a quiescent operation of the semiconductor memory device.

Also, a preferable mode is one wherein the signal informing a quiescent operation of the semiconductor memory device is a negative logical signal and wherein the n-type MOS transistor receives the signal as an inverted signal through an inverter.

Also, a preferable mode is one wherein the MOS transistor and the voltage dividing resistor are connected in parallel and wherein the voltage dividing resistor is short-circuited when the inverted signal is fed to the MOS transistor.

Also, a preferable mode is one wherein the differential circuit is provided with a pair of MOS transistors being connected in parallel with each other and each having a gate and wherein the gate of one of said MOS transistors acts as an input terminal to receive a reference voltage from the reference voltage generating circuit and the gate of the other of the MOS transistors acts as an input terminal to receive an output voltage from the voltage control circuit.

Also, a preferable mode is one wherein the one MOS transistor making up the pair of MOS transistors is an n-type MOS transistor and wherein the switching device in the reference voltage generating circuit, while the semiconductor memory device is in quiescent operation, forms a short-circuit across the voltage dividing resistor in order to reduce the reference voltage to be applied to the gate of the n-MOS transistor.

According to a second aspect of the present invention, there is provided a voltage dropping power unit for dropping a supply voltage and for applying a dropped voltage to a semiconductor memory device, including:

a voltage control circuit to produce a voltage to be controlled depending on a control voltage in order to supply an operating voltage to the semiconductor memory device;

a reference voltage generating circuit to generate a reference voltage used to produce the control voltage;

a voltage differential circuit to perform a differential operation so that the voltage output from the voltage control circuit is made equal to the reference voltage irrespective of a level of the voltage output from said voltage control circuit; and wherein the reference voltage generating circuit is provided with a voltage dividing resistor to produce the reference voltage by receiving a current from a supply voltage source and a first switching device to interrupt a current to the voltage dividing resistor while the semiconductor memory device is in quiescent operation and wherein the voltage differential circuit is provided with a switching circuit used to switch on or off a differential operating current, which is operated to interrupt the operating current while the semiconductor memory device is placed in a quiescent state.

In the foregoing, a preferable mode is one wherein the switching circuit has an active element operated to increase or decrease the operating current for calibrating sensitivity of differential operations of the differential circuit while the semiconductor memory device is in operation and operated to interrupt the operating current while the semiconductor memory device is in quiescent operation and a control section used to control the operations of the active element.

Also, a preferable mode is one wherein the active element is a MOS transistor to increase or decrease operating currents depending on a signal fed to a gate of the MOS transistor and wherein the control section includes a switching mechanism operated to allow an instruction signal having an adjustable voltage value to be fed to the gate of the transistor while the semiconductor memory device is in operation and not to allow the signal to be fed to the gate while the semiconductor memory device is in quiescent operation and a second switching device to apply a voltage required to activate the MOS transistor to the gate of said MOS in order to interrupt the operating current while the semiconductor memory device is in quiescent operation.

Also, a preferable mode is one wherein the switching mechanism is provided with a CMOS (Complementary MOS) circuit in which complementary MOS transistors are connected in parallel and a gate of each of the complementary MOS transistor receives each of complementary control signals.

Also, a preferable mode is one wherein the voltage control circuit has a first active element to supply a voltage to be controlled by the control voltage to the semi conductor memory device and wherein the voltage differential circuit has a second switching device to supply a control voltage for interrupting the first active element to the active element while the semiconductor memory device is in quiescent operation.

Also, a preferable mode is one wherein the first switching device included in said reference voltage generating circuit is provided with a transistor operated to interrupt currents to be supplied to the voltage dividing resistor when the transistor receives a signal informing a quiescent operation of the semiconductor memory device.

Also, a preferable mode is one wherein the voltage control circuit has a second active element being connected in parallel with the first active element to supply a predetermined constant voltage to the semiconductor memory device while the semiconductor memory device is in quiescent operation.

Also, a preferable mode is one wherein the second active element consists of a transistor operated to supply a predetermined constant voltage to the semiconductor memory device when the transistor receives a signal informing a quiescent operation of the semiconductor memory device.

Also, a preferable mode is one wherein the voltage control circuit has a second active element being connected in serial to an output terminal of the first active element in order to supply a predetermined constant voltage to the semiconductor memory device while the semiconductor memory device is in quiescent operation.

Also, a preferable mode is one wherein the second active element consists of a transistor device operated to supply a ground voltage to the semiconductor memory device when the transistor receives a signal informing a quiescent operation of the semiconductor memory device.

Furthermore, a preferable mode is one wherein the voltage control circuit includes a third active element used to supply a voltage to be controlled depending on the control voltage to the semiconductor memory device and a fourth active element being connected in serial to an output terminal of the third active element used to output a voltage being different from an output voltage from the second active element and being equal to a ground voltage when the fourth active element receives a signal informing a quiescent operation of the semi conductor memory device.

BRIEF DESCRIPTION OF THE DRAWINGS

The above and other objects, advantages and features of the present invention will be more apparent from the following description taken in conjunction width the accompanying drawings in which.

DESCRIPTION OF THE PREFERRED EMBODIMENTS

Best modes of carrying out the present invention will be described in further detail using various embodiments with reference to the accompanying drawings.

First Embodiment

Figure 1:
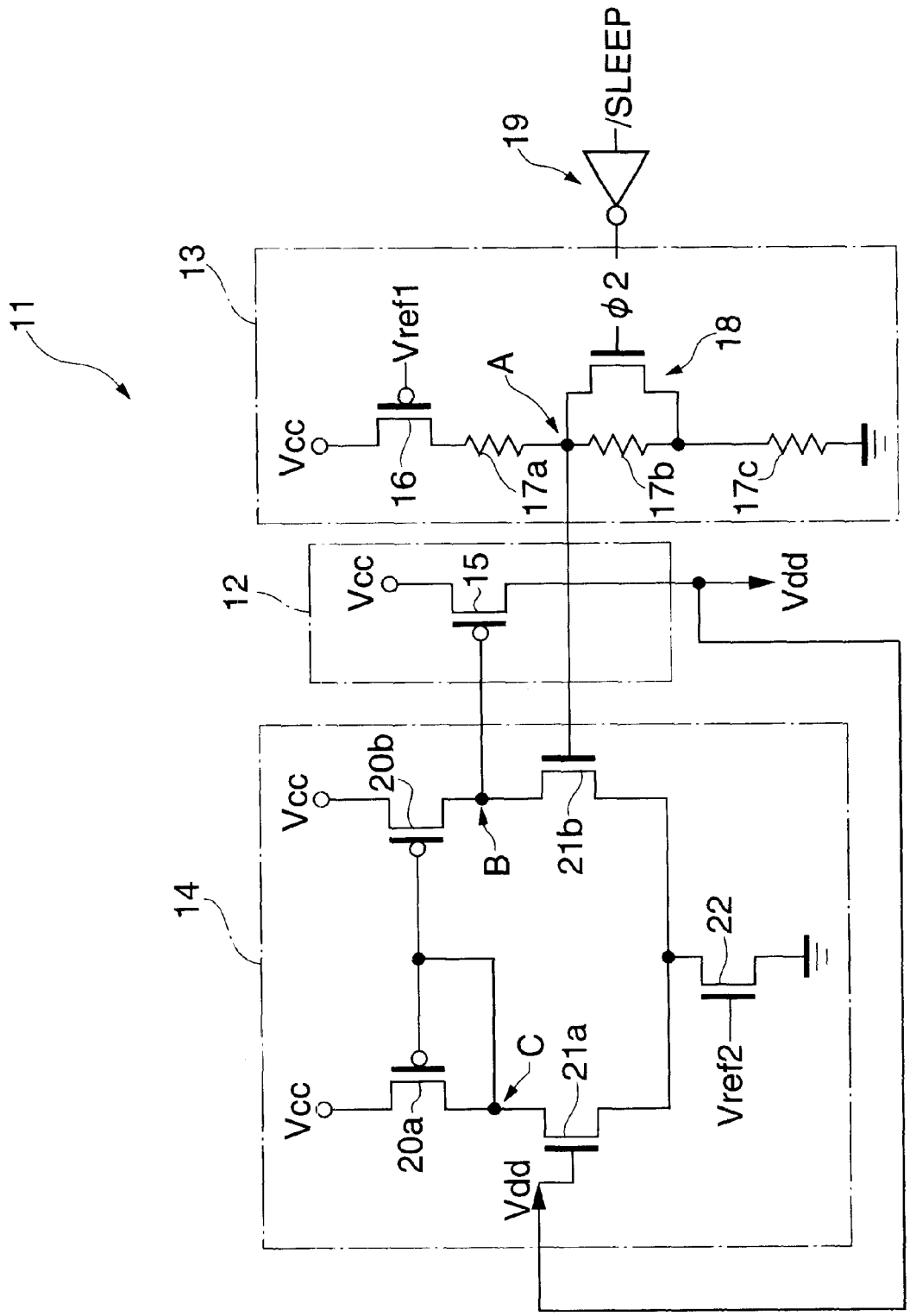
FIG. 1 is a schematic block diagram showing configurations of a voltage-dropping power unit according to a first embodiment of the present invention.

As shown in FIG. 1, a voltage-dropping power unit 11 of a first embodiment is provided with a voltage control circuit 12 adapted to receive a supply power Vcc and to output a dropped voltage Vdd being lower than the supply voltage and having a voltage value to be controlled depending on a control voltage to be used as an operating voltage for, for example, a RAM (not shown), a reference circuit 13 to produce a specified reference voltage and a differential circuit 14 to perform a differential operation so that the dropped voltage is equal to the reference voltage.

The voltage control circuit 12 has an active element 15 as in the case of the conventional voltage-dropping power unit. The active element 15 is composed of, in the case of an example shown in FIG. 1, a p-type MOSFET (Metal Oxide Semiconductor Field Effect Transistor)(hereinafter referred to as a "pMOS transistor") to a source of which the supply power Vcc is applied and to a gate of which an output voltage from the differential circuit 14 is applied as the control voltage. In the voltage control circuit 12, a current flowing from the source of the pMOS transistor to which the supply power Vcc is applied to its drain is controlled by the control voltage from the differential circuit 14. This allows the voltage control circuit 12 to drop the supply voltage and to output a drain voltage obtained by the voltage dropping as the dropped voltage Vdd for the semiconductor memory device. Moreover, the voltage control circuit 12 feeds the dropped voltage Vdd through a feedback loop to the differential circuit 14 as a feedback voltage.

The reference circuit 13 is provided with a well-known active element 16 composed of, for example, a pMOS transistor used to set a reference voltage, a group of voltage-dividing resistors adapted to produce the reference voltage and composed of resistors 17a, 17b and 17c each being connected, in serial, to the active element 16 and a switching device 18 to form a by-pass across the resistor 17b. To a source of the pMOS transistor 16, that is, the active element 16 is applied a supply voltage Vcc and to its drain is applied are connected, in serial, the resistors 17a, 17b and 17c in order.

To a gate of the pMOS transistor 16 is applied an adjustable gate voltage Vref1 and an operating current controlled by the gate voltage Vref1 flows through the pMOS transistor 16 to the voltage-dividing resistor 17a.

Since a resistance value of the pMOS transistor 16 is so small that it can be ignored, when compared with a resistance value of each of the resistors 17a, 17b and 17c, a potential Va at a node A being a connection point between the resistors 17a and 17b can be given by the following equation (1)

$$Va = Vcc \times (R_{17b} + R_{17c})/(R_{17a} + R_{17b} + R_{17c}) \quad (1)$$

where the "$R_{17a}$" is a resistance of the resistor 17a, the "$R_{17b}$" is a resistance of the resistor 17b and the "$R_{17c}$" is a resistance of the resistor 17c. The voltage Va at the node A is fed to the differential circuit 14 as a reference voltage for the differential circuit 14.

The switching device 18 in the reference circuit 13 is composed of an n-type MOSFET (hereinafter referred to as an "nMOS transistor"). A drain of the nMOS transistor 18 is connected to the node A and its source is connected between the both resistors 17b and c. To a gate of the nMOS transistor 18 is fed a signal indicating a quiescent operation of the semiconductor memory device while it is placed in a quiescent state. In the example shown in FIG. 1, the signal indicating the quiescent operation is fed through an inverter 19 as an inverted quiescent signal ($\phi 2$) which is the inverted signal of a quiescent signal (/SLEEP=/$\phi 1$). The nMOS transistor 18 is brought into conduction when it receives the inverted quiescent signal ($\phi 2$), causing a short-circuit across the resistor 17b to be formed.

As a result, a voltage value of the reference voltage, that is, a node voltage Va' to be fed from the reference circuit 13 to the differential circuit 14 wile the semiconductor memory device is in the quiescent operation, is given by the following equation (2):

$$Va' = Vcc \times R_{17c}/(R_{17a} + R_{17c}) \quad (2)$$

As a result, since the node potential Va', while the semiconductor device is placed in a quiescent state, becomes lower than the node potential Va, the reference voltage to be fed to the differential circuit 14 drops.

Moreover, while the semiconductor memory device is placed in a quiescent state, since the nMOS transistor 18 is brought into conduction which forms the short-circuit having a resistance being much smaller than that of the resistor 17b and the resistance of the short-circuit may be neglected, in the reference circuit 13, power consumption occurring when operating currents flow from the pMOS transistor 16 through the resistor 17c to a ground is reduced.

The differential circuit 14 is provided with a pair of active elements 20a and 20b, each being composed of a pMOS transistor, disposed so as to be symmetric with respect to each other. To a source of each of the pMOS transistor 20a and the pMOS transistor 20b is applied a supply voltage Vcc. To a drain of the pMOS transistor 20a is connected a drain of an active element 21a composed of a nMOS transistor. A node C being a connection point between the nMOS transistor 21a and pMOS transistor 20a is connected to each of the pMOS transistor 20a and the pMOS transistor 20b. To a drain of the pMOS transistor 20b is connected a drain of active element 21b composed of a nMOS transistor. A voltage taken from a node B connected between the pMOS transistor 20b and the nMOS transistor 21b is output to the voltage control circuit 12 as the control voltage. To each of sources of the nMOS transistor 21a and the nMOS transistor 21b is connected a drain of an active element 22 composed of an nMOS transistor used to calibrate sensitivity of differential operations of the differential circuit 14, which is described later. The nMOS transistor 22 whose source is connected to a ground, when a gate voltage Verf2 being adjustable for sensitivity calibration is applied to its gate of the nMOS transistor 22, is adapted to control operating currents flowing through a current path composed of the pMOS transistor 20a and the nMOS transistor 21a and through a current path composed of the pMOS transistor 20b and the nMOS transistor 21b.

The differential circuit 14, when the dropped voltage Vdd is fed back from the voltage control circuit 12 to a gate of the nMOS transistor 21a and when the reference voltage is fed to a gate of the nMOS transistor 21b from the reference circuit 13, performs differential operations in order to make the dropped voltage Vdd equal to the reference voltage, that is, to make an amount of the current flowing through each of the two current paths equal.

While the semiconductor memory device is placed in a quiescent state, as described above, since the reference voltage fed from the reference circuit 13 drops, in the differential circuit 14, an amount of the current flowing through the current path containing the nMOS transistor 21b decreases. As a result, in the differential circuit 14, an amount of the current flowing through the other current path containing the nMOS transistor 21a is decreased by the differential operations, thus reducing power consumption in the differential circuit 14 while the semiconductor memory is in a quiescent operation.

As described above, in the voltage-dropping power unit 11 of the first embodiment, while the semiconductor memory device is placed in a quiescent state, since the inverted quiescent signal (φ2) is fed to the nMOS transistor 18 of the reference circuit 13, the voltage-dividing resistor 17b of the reference circuit 13 is short-circuited, thus reducing power consumption in the resistor 17b which leads to reduction of power consumption in the entire reference circuit itself and to power consumption in the differential circuit 14 operating depending on the reference voltage fed from the reference circuit.

Thus, according to the voltage-dropping power unit 11 of the first embodiment, by controlling a supply of the quiescent signal to be fed to the reference circuit 13, power consumption in the voltage-dropping power unit 11 while the semiconductor memory device is in a quiescent operation can be reduced more compared with the case when the semiconductor memory device is in operation.

In the voltage-dropping power unit of the first embodiment, in order to prevent the dropped voltage Vdd generated to be equal to the reference voltage being at a ground level during a quiescent operation of the semiconductor memory device, the divided voltage Va' as the reference voltage is supplied; however, instead of this configuration, when a voltage at a ground level as the dropped voltage during a quiescent operation of the semiconductor memory device is required, in order to short-circuit both the resistors 17b and 17c by using the nMOS transistor 18, the reference circuit 13 may be so constructed that the nMOS transistor 18 is connected in parallel to both the resistors 17b and 17c.

Second Embodiment

Figure 2:
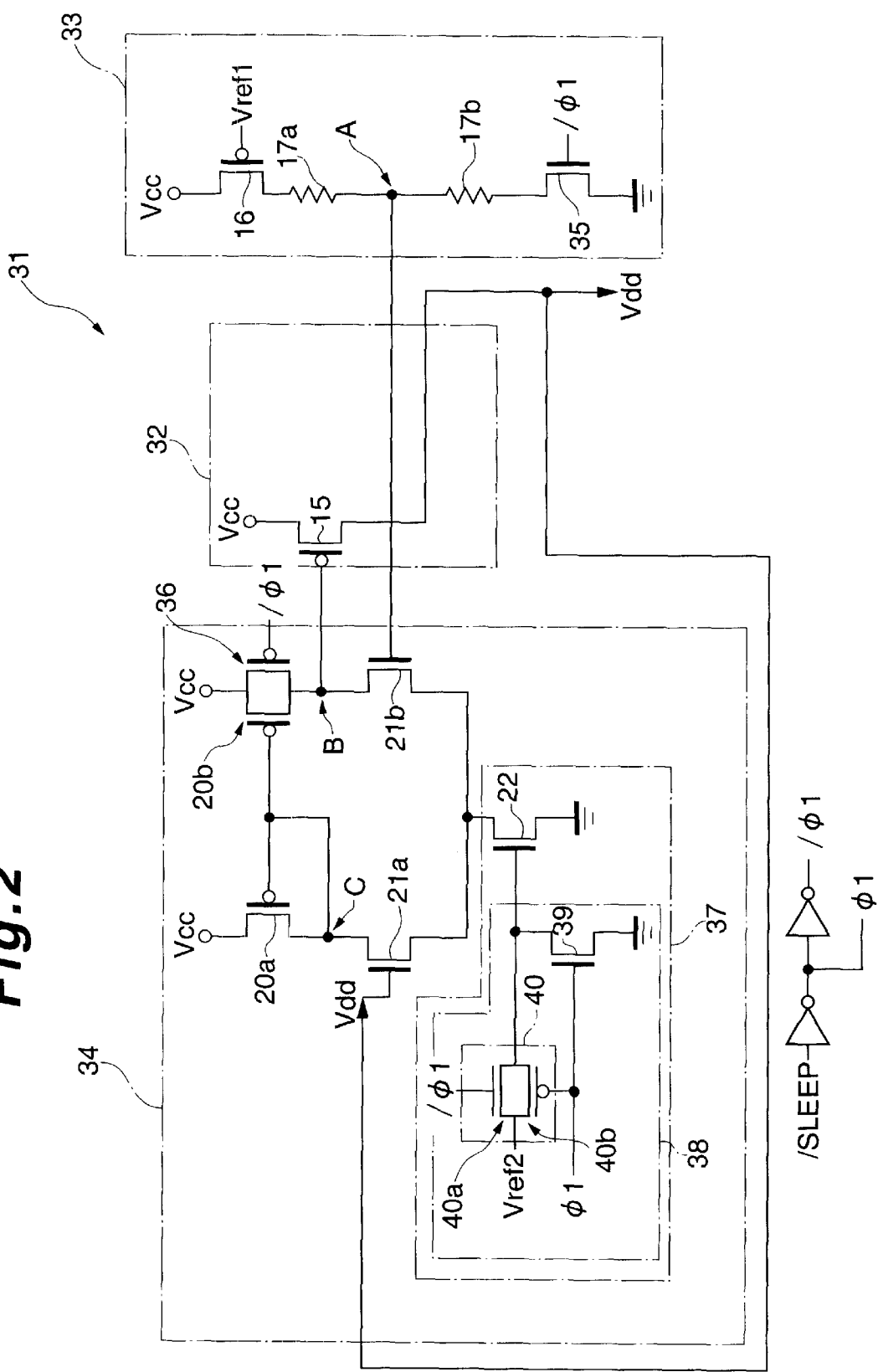
FIG. 2 is a schematic block diagram showing configurations of a voltage-dropping power unit according to a second embodiment of the present invention.

As shown in FIG. 2, a voltage-dropping power unit 31 is provided with a voltage control circuit 32, a reference circuit 33 and a differential circuit 34. In the voltage-dropping power unit 31, as in the case of the first embodiment, when the differential circuit 34 receives a dropped voltage Vdd from the voltage control circuit 32 and a reference voltage from the reference circuit 33, a control voltage used to cause an amount of a current flowing through each of two current paths in the differential circuit 34 to be equal is fed to the voltage control circuit 32 from the differential circuit 34. In FIG. 2, same reference numbers are assigned to parts of each of the voltage control circuit 32, reference circuit 33 and differential circuit 34 having the same functions as in the first embodiment in FIG. 1.

The voltage control circuit 32, as in the case of the voltage control circuit 12 of the first embodiment, is provided with a pMOS transistor 15 adapted to generate the dropped voltage Vdd.

The reference circuit 33 is provided with a pMOS transistor 16 to set a reference voltage, resistors 17a and 17d making up a group of voltage-dividing resistors connected in serial to the pMOS transistor 16 and adapted to generate the reference voltage and a switching device 35 composed of an nMOS transistor 35 adapted to switch on or off a flow of an operating current of the reference circuit 33. A resistance of the resistor 17d making up a group of the voltage-dividing resistors is equal to a combined resistance of resistors composed of the resistor 17b and the resistor 17c of the first embodiment.

A drain of the nMOS transistor 35 is connected to the resistor 17d and its source is connected to a ground. While the semiconductor memory device is placed in a quiescent state, a quiescent signal (/φ1) informing the quiescent operation of the semiconductor memory device is fed to a gate of the nMOS transistor 35 and, while it is in operation, an inverted quiescent signal (φ1) being an inverted signal of the quiescent signal (/φ1) is fed to the gate of the nMOS transistor 35. The nMOS transistor 35, while the semiconductor memory device is in operation, is brought into conduction when the inverted quiescent signal (φ1) is fed to its gate, which causes an operating current in the reference circuit 33 to flow through the pMOS transistor 16, the group of voltage-dividing resistors and the nMOS transistor 35 to a ground.

The nMOS transistor 35, while the semiconductor memory device is placed in a quiescent state, when the quiescent signal (/φ1) is fed to its gate, is turned OFF, causing the current path of the reference circuit 33 to be interrupted. As a result, while the semiconductor memory device is in quiescent operation, the operating current does not flow in the reference circuit 33, thus enabling power consumption to be reduced.

In the differential circuit 34, a switching circuit 36 used to apply a supply power Vcc to a gate of the pMOS transistor 15 of the voltage control circuit 32 in order to interrupt the pMOS transistor 15 is connected in parallel to the pMOS transistor 20b. While the semiconductor memory device is in quiescent operation, the quiescent signal (/φ1) is fed to a gate of the pMOS transistor 36. While the semiconductor memory device is placed in an operating state, the inverted quiescent signal (φ1) is fed to the gate of the pMOS transistor 36, causing the pMOS transistor 36 to be interrupted. As a result, since a control voltage based on the differential operation of the differential circuit 34 is applied to the gate of the pMOS transistor 15 of the voltage control circuit 32, a dropped voltage Vdd controlled by the control voltage based on the supply voltage Vcc is output while the semiconductor memory device is placed in an operating state.

On the other hand, the pMOS transistor 36, when receiving the quiescent signal (/φ1) while the semiconductor memory device is in quiescent operation, is brought into conduction, causing a voltage at a supply voltage Vcc level to be supplied to a drain of the pMOS transistor 36, that is, to the node B. As a result, irrespective of the differential operation of the pMOS transistor 20b connected in parallel to the switching device 36, since the voltage at the supply voltage Vcc level is fed as a control voltage to the pMOS transistor 15, while the semiconductor memory device is placed in a quiescent state, the pMOS transistor 15 is turned OFF.

The differential circuit 34 is provided with a switching circuit 37 containing a nMOS transistor 22 adapted to switch on or off a flow of the operating current 37. In the switching circuit 37, a control section 38 is connected to a gate of the nMOS transistor 22 to control the nMOS transistor 22. The control section 38 has a switching device composed of an nMOS transistor 39 used to cause the nMOS transistor 22 to perform an open operation to interrupt a current to be used for the differential operation of the differential circuit 34 and a switching mechanism 40 used to supply a gate voltage Verf2 to the nMOS transistor 22.

A drain of the nMOS transistor 39 is connected to a gate of the nMOS transistor 22 and a source of the nMOS transistor 39 is connected to a ground. The switching mechanism 40 is composed of a complementary pair of MOSFETs constructed of nMOS transistor 40a and pMOS transistor 40b, both being connected in parallel with each other. The voltage Verf2 is fed to a drain of the nMOS transistor 40a and to a source of the pMOS transistor 40b. A source of the nMOS transistor 40a and a drain of the pMOS transistor 40b are connected to a source of the nMOS transistor 22. To a gate of the nMOS transistor 40b is connected to a gate of the nMOS transistor 39.

The complementary pair of the nMOS transistor 40a and pMOS transistor 40b making up the switching mechanism 40 is operated to switch on or off the supply of the voltage Verf2 to the nMOS transistor 22 and, since "gm" (mutual conductance) being one of characteristics of a transistor contained in the switching mechanism 40 is improved by having configurations as above, as well known, serves to increase responsiveness of the nMOS transistor 22.

While the semiconductor memory device is placed in a quiescent state, to a gate of the nMOS transistor 40a is fed the quiescent signal (/ϕ1) and, at the same time, to a gate of the pMOS transistor 40b is fed the inverted quiescent signal (ϕ1). At this time, to the gate of the nMOS transistor 39 is fed the quiescent signal (/ϕ1).

While the semiconductor memory device is in operation, the quiescent signal (/ϕ1) is applied to the gate of the nMOS transistor 39, causing the nMOS transistor 39 to be interrupted. At this point, to the gate of the nMOS transistor 40a is fed the inverted quiescent signal (ϕ1) and, at the same time, to the gate of the pMOS transistor 40b is fed the quiescent signal (/ϕ1), causing the nMOS transistor 40a and pMOS transistor 40b of the switching mechanism 40 to be brought into conduction. As a result, since the voltage Verf2 flows through the switching mechanism to the nMOS transistor 22, while the semiconductor memory device is in operation, a proper amount of the operation current flows through the differential circuit 34. On the other hand, as described above, while the semiconductor memory device is in quiescent operation, since the quiescent signal (/ϕ1) is fed to the gate of the nMOS transistor 40a and the inverted quiescent signal (ϕ1) is fed to the gate of the pMOS transistor 40b, both the MOS transistors are turned OFF. The inverted quiescent signal (ϕ1) is fed to the gate of the nMOS transistor 39, causing the nMOS transistor 39 to be brought into conduction, which a voltage at a ground level is applied to a gate of the nMOS transistor 22. As a result, since the nMOS transistor 22 receiving the gate voltage at the ground level is held in an interrupted state, the operating current through the differential circuit 34 is interrupted, thus enabling reduction of power consumption in the differential circuit 34.

As described above, in the voltage-dropping power unit 31, when the quiescent signal is fed to the nMOS transistor 35 of the reference circuit 33 while the semiconductor circuit is in quiescent operation, power consumption in the reference circuit 33 is lowered and, at the same time, the quiescent signal is fed to the nMOS transistor 40a in the control section 38 of the differential circuit 34 and the inverted quiescent signal is fed to the nMOS transistor 39 and pMOS transistor 40b, thus enabling power consumption in the differential circuit 34 to be reduced.

Moreover, while the semiconductor memory device is placed in a quiescent state, since the pMOS transistor 15 of the voltage control circuit 32 is turned OFF, a supply of the dropped voltage Vdd from the voltage dropping device 31 is interrupted.

Thus, in the voltage dropping power unit 31 of the second embodiment, by control on the supply of the quiescent signal to the reference circuit 33 and on the supply of the inverted quiescent signal to the differential circuit 34, power consumption in the voltage-dropping power unit 31 while the semiconductor memory device is in quiescent operation can be reduced more compared with the case when the semiconductor memory device is in operation. Moreover, currents flow at lower voltage in the unit 31, which also serves to lower power consumption in the voltage-dropping power unit while the semiconductor memory device is placed in a quiescent state.

Third Embodiment

In the voltage control circuit 32 of the voltage-dropping power unit of the second embodiment, as described above, by the control signal fed while the semiconductor memory device is placed in a quiescent state, the pMOS transistor 15 of the voltage control circuit is placed in an interrupted state. In such the interrupted state, a value of the dropped voltage Vdd becomes unstable. In order to prevent the dropped voltage Vdd becoming unstable, such a voltage-dropping power unit provided in the third embodiment can be used which is adapted to supply a predetermined voltage to a dropped voltage Vdd while the semiconductor memory device is in quiescent operation.

Figure 3:
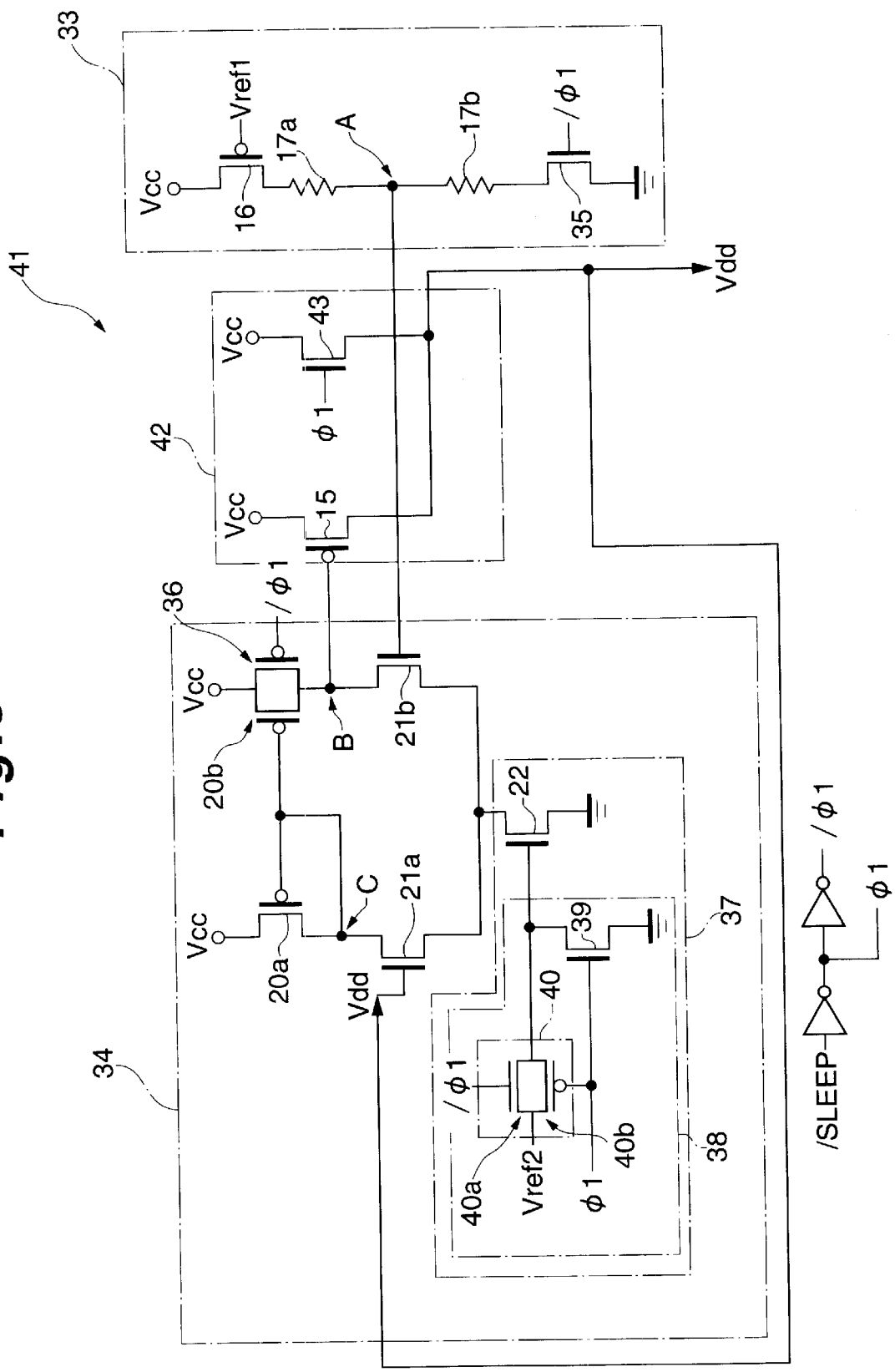
FIG. 3 is a schematic block diagram showing configurations of a voltage-dropping power unit according to a third embodiment of the present invention.

As shown in FIG. 3, the reference circuit 33 and differential circuit 34 embedded in the fourth embodiment are the same as those in the third embodiment. The voltage-dropping power unit 41 of the fourth embodiment is provided newly with a voltage control circuit 42. The voltage control circuit 42 has the pMOS transistor 15 and an active element 43 composed of an nMOS transistor 43 connected in parallel to a drain of the pMOS transistor 15. A supply voltage Vcc is applied to a drain of the nMOS transistor 43. A source of the nMOS transistor 43 is connected to the drain of the pMOS transistor 15 and a dropped voltage Vdd is taken out from a connection point between the pMOS transistor 15 and the nMOS transistor 43. While the semiconductor memory device is placed in a quiescent state, the inverted quiescent signal (ϕ1) is fed to a gate of the nMOS transistor 43.

While the semiconductor memory device is in operation, in the voltage control circuit 42, the nMOS transistor 43, when its gate receives the quiescent signal (/ϕ1), is placed in an interrupted state. As described above, while the semiconductor memory device is in operation, when the pMOS transistor 36 of the differential circuit 34 is brought into conduction, a control voltage based on a differential operation of the differential circuit 34 is applied to a gate of the pMOS transistor 15. As a result, in the voltage control circuit 42, since the pMOS transistor 15 is turned ON, a dropped voltage Vdd is output. While the semiconductor memory device is in quiescent operation, as described in the second embodiment, the pMOS 15 is placed in an interrupted state. On the other hand, since the inverted quiescent signal (φ1) is fed to a gate of the nMOS transistor 43, the nMOS transistor 43 is brought into conduction. As a result, a voltage obtained by subtracting a threshold voltage Vt of the nMOS transistor 43 from the supply voltage Vcc, that is, the voltage "Vcc−Vt" is output as a dropped voltage from the voltage control circuit 42.

Thus, in the voltage dropping power unit 41 of the third embodiment, by the control on the supply of the quiescent signal to the reference circuit 33 and to the differential circuit 34, power consumption in the voltage-dropping power unit 41 while the semiconductor memory device is in quiescent operation can be reduced more compared with the case when the semiconductor memory device is in operation. Moreover, since the voltage "Vcc−Vt" can be obtained as the dropped voltage Vdd to be applied while the semiconductor memory device is in quiescent operation and therefore a stable dropped voltage is made available, it is possible to achieve stability in holding a content stored in a main part of a semiconductor memory.

Fourth Embodiment

Figure 4:
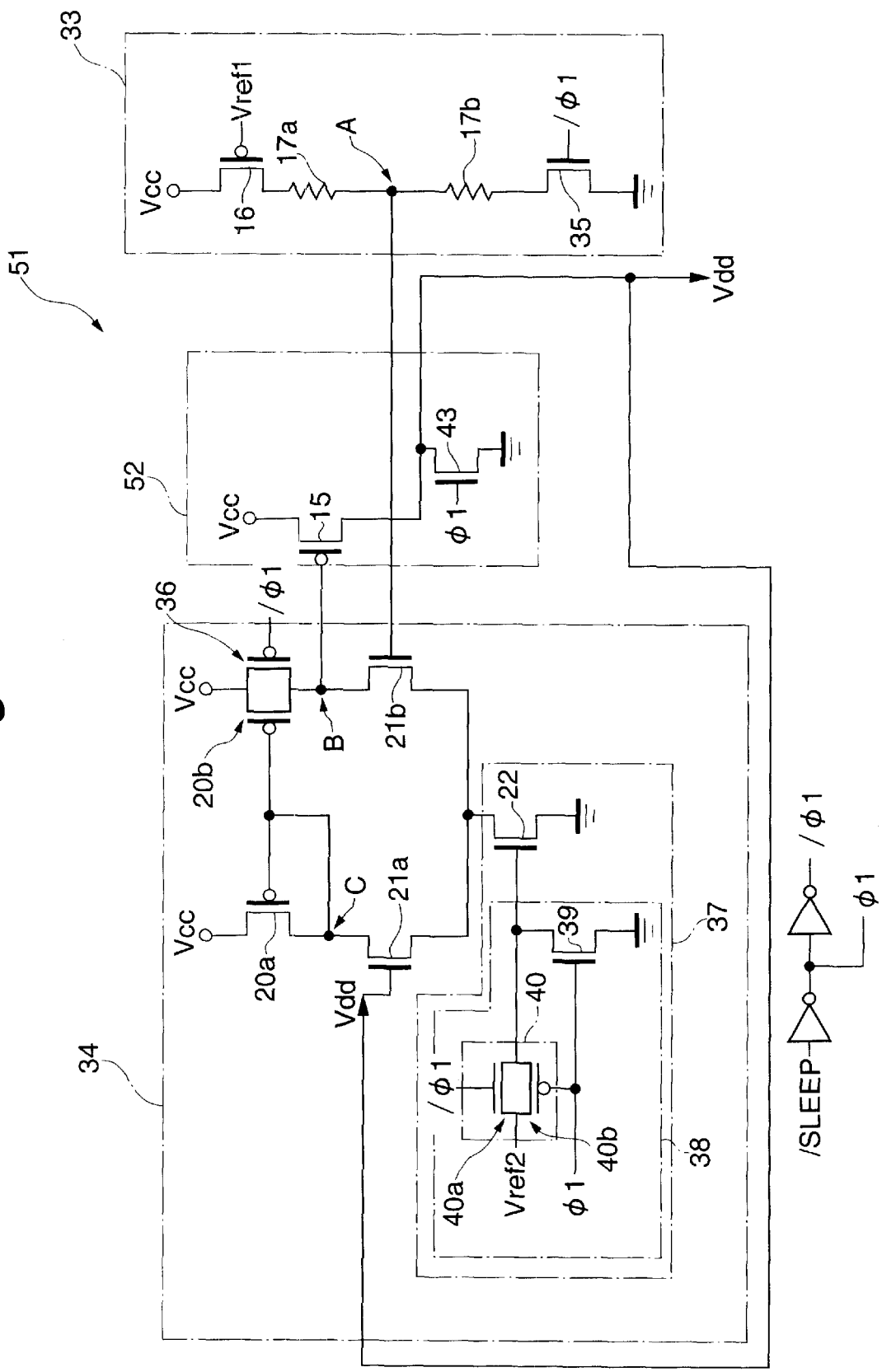
FIG. 4 is a schematic block diagram showing configurations of a voltage-dropping power unit according to a fourth embodiment of the present invention.
Figure 5:
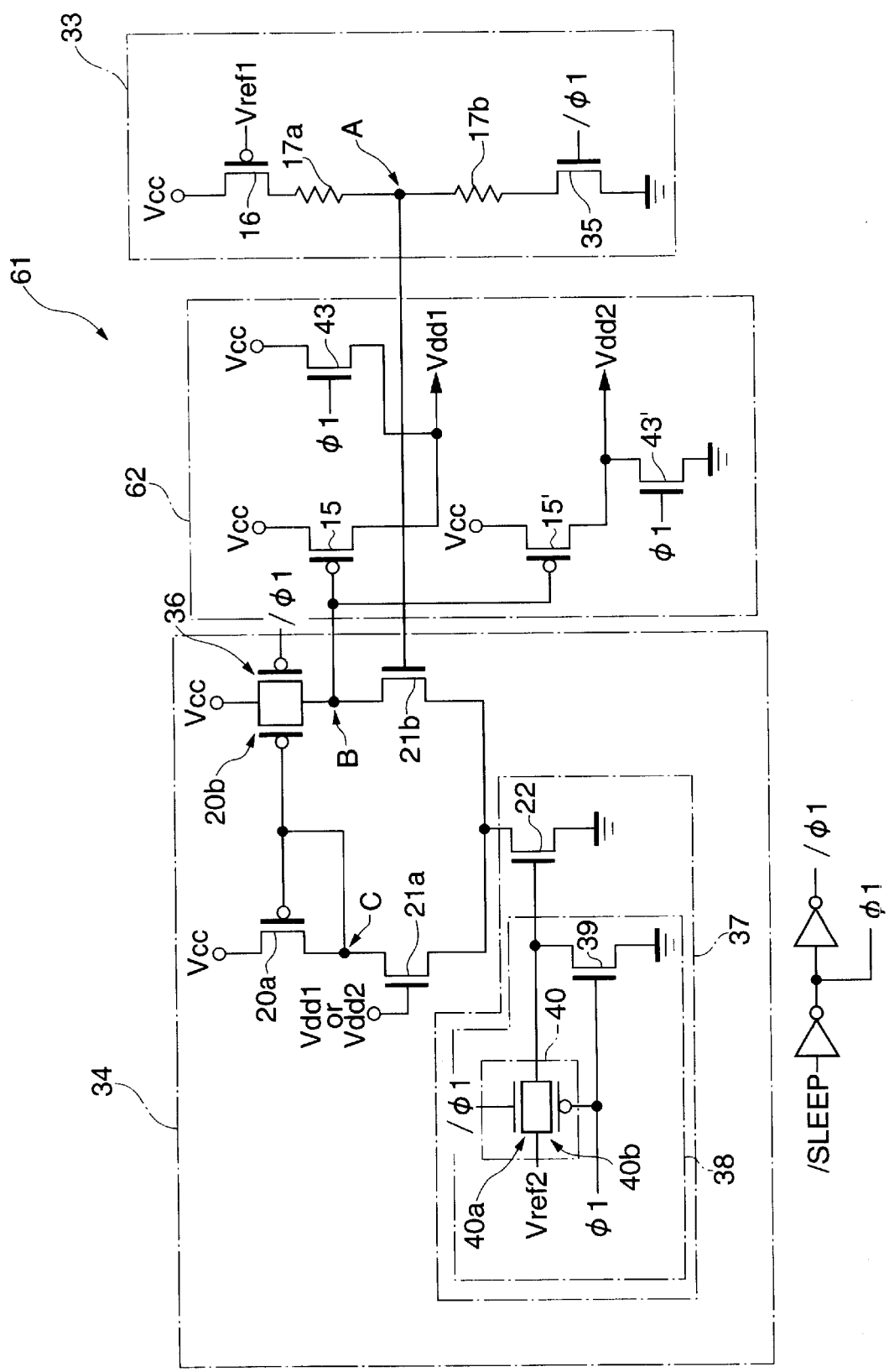
FIG. 5 is a schematic block diagram showing configurations of a voltage-dropping power unit according to a fifth embodiment of the present invention.

As shown in FIG. 4, configurations of a voltage dropping power unit 51 of a fourth embodiment are basically the same as those in the third embodiment and therefore same reference numbers are assigned to parts having the same functions as in the third embodiment. In the voltage dropping power unit 51 of the fourth embodiment, an nMOS transistor 43 is connected in serial to the pMOS transistor 15 of a voltage control circuit 52. In the third embodiment, the supply voltage Vcc is applied to the drain of the nMOS transistor 43 of the voltage control circuit 52 and its source is connected to the drain of the pMOS transistor 15, while, in the fourth embodiment, a drain of the nMOS transistor 43 is connected to the drain of the pMOS transistor 15 and a source of the nMOS transistor 43 is connected to a ground. In the voltage control circuit 52, a dropped voltage Vdd is taken out from a connection point between the nMOS transistor 43 and the pMOS transistor 15.

In the voltage control circuit 52, while a semiconductor memory device is in operation, as in the case of the voltage control device of the third embodiment, the nMOS transistor 43 is turned OFF and when the pMOS transistor 15 is brought into conduction, a dropped voltage Vdd calibrated by a control voltage from a differential circuit 34. Also, in the voltage control circuit 52, while the semiconductor memory device is in quiescent operation, as in the case of the voltage control device of the third embodiment, the pMOS transistor 15, when receiving the control voltage, is placed in an interrupted state. An inverted quiescent signal (φ1) is applied to a gate of the nMOS transistor 43, causing the nMOS transistor 43 to be brought into conduction. In the fourth embodiment, since the source of the nMOS transistor 43 is connected to a ground, while the semiconductor memory device is in quiescent operation, a dropped voltage at a ground level is output from the voltage control circuit 52.

Thus, according to the voltage dropping power unit of the fourth embodiment, the dropped voltage Vdd can be made stable and power consumption in main parts of the semiconductor memory device can be reduced.

Fifth Embodiment

Figure 6:
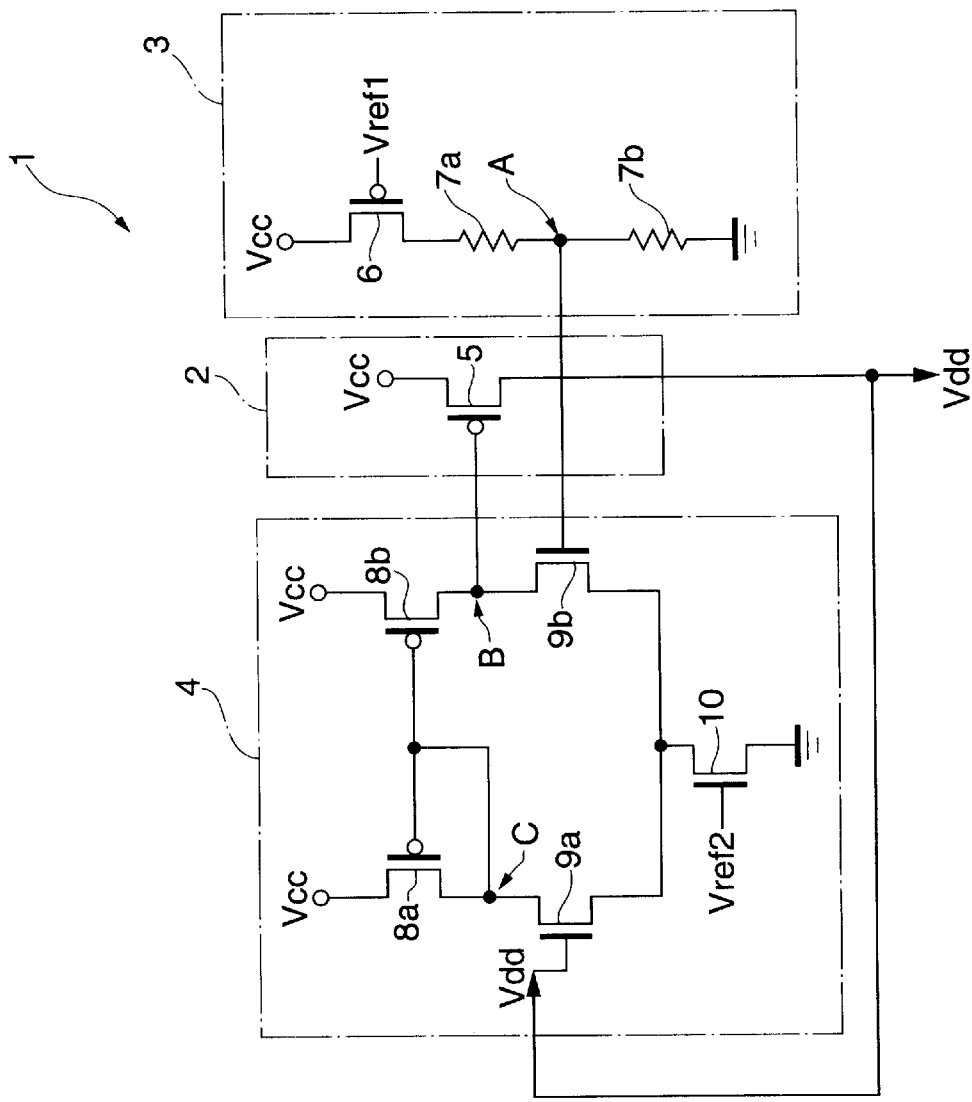
FIG. 6 is a schematic block diagram showing configurations of a conventional voltage-dropping power unit.

As shown in FIG. 6, configurations of a voltage dropping power unit 61 of a fifth embodiment are basically the same as those in the fourth embodiment and therefore same reference numbers are assigned to parts having the same functions as in the fourth embodiment. In a voltage control circuit 62 of the voltage dropping power unit 61 of the fifth embodiment, in addition to the pMOS transistor 15 and the nMOS transistor 43 as in the case of the third embodiment, a pMOS transistor 15' and nMOS transistor 43' as in the case of the fourth embodiment, disposed symmetrically disposed relative to the nMOS transistor 15 and the pMOS transistor 43, are mounted.

In the voltage control circuit 62, a control voltage is applied by a differential circuit 34 to a gate of the pMOS transistor 15 and to a gate of the pMOS transistor 34 and, while a semiconductor memory device is in quiescent operation, an inverted quiescent signal (φ1) is fed to a gate of the nMOS transistor 43 and to a gate of the nMOS transistor 43'. While a semiconductor memory device is in operation, since a pMOS transistor 36 is placed in an interrupted state, a control voltage based on differential operations of a differential circuit 34 is applied to a gate of the pMOS transistor 15 and to a gate of the pMOS transistor 15'. At this time, since the nMOS transistors 43 and 43' are placed in an interrupted state, a dropped voltage is obtained from the nMOS transistor 43 and a dropped voltage having the same voltage level as that obtained from the nMOS transistor 43 is also obtained from the nMOS transistor 43'.

Moreover, while the semiconductor memory device is in quiescent operation, since the pMOS transistor 36 is brought into conduction, a control voltage at a level of a supply voltage Vcc is applied to each of gates of the pMOS transistors 15 and 15', causing the pMOS transistors 15 and 15' to be placed in an interrupted state. On the other hand, each of the nMOS transistors 43 and 43', when receiving the inverted quiescent signal (φ1), is brought into conduction.

In the voltage control circuit 62, while the semiconductor memory device is in quiescent operation, since the nMOS transistor 43 is brought into conduction, as in the case of the third embodiment, a dropped voltage Vdd 1 at the level of "Vcc−Vt" is output and, at the same time, since the nMOS transistor 43' is brought into conduction, as in the case of the fourth embodiment, a dropped voltage Vdd 2 at the ground level is output.

In the voltage dropping power unit 61, by feeding back both voltages Vref1 and Vref2 output from the voltage control circuit 62 selectively to a gate of an nMOS transistor 21a, either of the dropped voltage Vdd1 or Vdd2, whichever desired, can be supplied to the semiconductor memory devices during quiescent operation of the memory device.

Thus, in the voltage dropping power unit 61 of the fifth embodiment, it is made possible to select a desired one voltage out of the two kinds of dropped voltages Vdd1 and Vdd2 each having a different voltage value and to lower power consumption in the semiconductor memory device.

As described above, according to the present invention, by control of a supply of a signal showing a quiescent operation of the semiconductor memory device to the voltage dropping power unit, power that is consumed in the reference generating circuit and the differential circuit embedded in the voltage dropping power unit can be reduced and, therefore, power consumption in the voltage dropping power unit during quiescent operation of the semiconductor memory device can be reduced more compared with the case when the semiconductor memory device is in operation.

It is apparent that the present invention is not limited to the above embodiments but may be changed and modified without departing from the scope and spirit of the invention.

What is claimed is:

1. A voltage dropping power unit for dropping a supply voltage and for applying a dropped voltage to a semiconductor memory device, comprising:

a voltage control circuit to produce a voltage to be controlled depending on a control voltage in order to supply an operating voltage to said semiconductor memory device;

a reference voltage generating circuit to generate a reference voltage used to produce said control voltage;

a voltage differential circuit to perform a differential operation so that said voltage output from said voltage control circuit is made equal to said reference voltage irrespective of a level of said voltage output from said voltage control circuit; and wherein said reference voltage generating circuit is provided with a voltage dividing resistor to generate said reference voltage by receiving a current from a supply voltage source and a switching device to form a short-circuit across said voltage dividing resistor in order to decrease an operating current flowing through said voltage differential circuit while said semiconductor memory device is placed in a quiescent state.

2. The voltage dropping power unit according to claim 1, wherein said switching device in said reference voltage generating circuit is provided with a transistor device operated to form said short-circuit when said semiconductor memory device is in quiescent operation.

3. The voltage dropping power unit according to claim 2, wherein said transistor device is an n-type MOS (Metal Oxide Semiconductor) transistor used to receive a signal informing a quiescent operation of said semiconductor memory device.

4. The voltage dropping power unit according to claim 3, wherein said signal informing a quiescent operation is a negative logical signal and wherein said n-type MOS transistor receives said signal as an inverted signal through an inverter.

5. The voltage dropping power unit according to claim 4, wherein said MOS transistor and said voltage dividing resistor are connected in parallel and wherein said voltage dividing resistor is short-circuited when said inverted signal is fed to said MOS transistor.

6. The voltage dropping power unit according to claim 1, wherein said reference voltage generating circuit includes an active device connected in serial to said voltage dividing resistor to adjust an amount of a current flowing through said voltage dividing resistor for making said reference voltage adjustable.

7. The voltage dropping power unit according to claim 1, wherein said differential circuit is provided with a pair of MOS transistors being connected in parallel with each other and each having a gate and wherein said gate of one of said MOS transistors acts as an input terminal to receive a reference voltage from said reference voltage generating circuit and said gate of the other of said MOS transistors acts as an input terminal to receive an output voltage from said voltage control circuit.

8. The voltage dropping power unit according to claim 7, wherein said one MOS transistor making up said pair of MOS transistors is an n-type MOS transistor and wherein said switching device in said reference voltage generating circuit, while said semiconductor memory device is in quiescent operation, forms a short-circuit across said voltage dividing resistor in order to reduce said reference voltage to be applied to said gate of said n-MOS transistor.

9. A voltage dropping power unit for dropping a supply voltage and for applying a dropped voltage to a semiconductor memory device, comprising:

a voltage control circuit to produce a voltage to be controlled depending on a control voltage in order to supply an operating voltage to said semiconductor memory device;

a reference voltage generating circuit to generate a reference voltage used to produce said control voltage;

a voltage differential circuit to perform a differential operation so that said voltage output from said voltage control circuit is made equal to said reference voltage irrespective of a level of said voltage output from said voltage control circuit; and wherein said reference voltage generating circuit is provided with a voltage dividing resistor to produce said reference voltage by receiving a current from a supply voltage source and a first switching device to interrupt a current to said voltage dividing resistor while said semiconductor memory device is in quiescent operation and wherein said voltage differential circuit is provided with a switching circuit used to switch on or off a differential operating current, which is operated to interrupt said operating current while said semiconductor memory device is placed in a quiescent state.

10. The voltage dropping device according to claim 9, wherein said switching circuit has an active element operated to increase or decrease said operating current for calibrating sensitivity of differential operations of said differential circuit while said semiconductor memory device is in operation and operated to interrupt said operating current while said semiconductor memory device is in quiescent operation and a control section used to control said operations of said active element.

11. The voltage dropping device according to claim 10, wherein said active element is a MOS transistor to increase or decrease operating currents depending on a signal fed to a gate of said MOS transistor and wherein said control section includes a switching mechanism operated to allow an instruction signal having an adjustable voltage value to be fed to said gate of said transistor while said semiconductor memory device is in operation and not to allow said signal to be fed to said gate while said semiconductor memory device is in quiescent operation and a second switching device to apply a voltage required to activate said MOS transistor to said gate of said MOS in order to interrupt said operating current while said semiconductor memory device is in quiescent operation.

12. The voltage dropping power unit according to claim 11, wherein said switching mechanism is provided with a CMOS (Complementary MOS) circuit in which complementary MOS transistors are connected in parallel and a gate of each of said complementary MOS transistor receives each of complementary control signals.

13. The voltage dropping power unit according to claim 9, wherein said voltage control circuit has a first active element to supply a voltage to be controlled by said control voltage to said semiconductor memory device and wherein said voltage differential circuit has a second switching device to supply a control voltage for interrupting said first active element while said semiconductor memory device is in quiescent operation.

14. The voltage dropping device according to claim 13, wherein said voltage control circuit has a second active element being connected in parallel with said first active element to supply a predetermined constant voltage to said semiconductor memory device while said semiconductor memory device is in quiescent operation.

15. The voltage dropping device according to claim 14, wherein said second active element consists of a transistor device operated to supply a predetermined constant voltage to said semiconductor memory device when said transistor device receives a signal informing a quiescent operation of said semiconductor memory device.

16. The voltage dropping power unit according to claim 14, wherein said voltage control circuit includes a third active element used to supply a voltage to be controlled depending on said control voltage to said semiconductor memory device and a fourth active element being connected in serial to an output terminal of said third active element used to output a voltage being different from an output voltage from said second active element and being equal to a ground voltage when said fourth active element receives a signal informing a quiescent operation of said semiconductor memory device.

17. The voltage dropping device according to claim 13, wherein said voltage control circuit has a second active element being connected in serial to an output terminal of said first active element in order to supply a predetermined constant voltage to said semiconductor memory device while said semiconductor memory device is in quiescent operation.

18. The voltage dropping power unit according to claim 17, wherein said second active element consists of a transistor device operated to supply a ground voltage to said semiconductor memory device when said transistor receives a signal informing a quiescent operation of said semiconductor memory device.

19. The voltage dropping power unit according to claim 9, wherein said first switching device included in said reference voltage generating circuit is provided with a transistor device operated to interrupt currents to be supplied to said voltage dividing resistor when said transistor receives a signal informing a quiescent operation of said semiconductor memory device.

* * * * *